(12) United States Patent
Ryu et al.

(10) Patent No.: US 8,361,849 B2
(45) Date of Patent: Jan. 29, 2013

(54) METHOD OF FABRICATING SEMICONDUCTOR DEVICE

(75) Inventors: Yong-Hwan Ryu, Seoul (KR); Jun Seo, Gyeonggi-do (KR); Eun-Young Kang, Seoul (KR); Jae-Seung Hwang, Gyeonggi-do (KR); Sung-Un Kwon, Jeonbuk (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/183,574

(22) Filed: Jul. 15, 2011

(65) Prior Publication Data

US 2011/0281428 A1 Nov. 17, 2011

Related U.S. Application Data

(62) Division of application No. 12/136,626, filed on Jun. 10, 2008, now Pat. No. 7,989,279.

(30) Foreign Application Priority Data

Jul. 2, 2007 (KR) .................. 10-2007-0066187

(51) Int. Cl.
*H01L 21/338* (2006.01)
*H01L 21/336* (2006.01)
(52) U.S. Cl. .................. 438/177; 438/284; 257/E21.495
(58) Field of Classification Search .................. 438/177, 438/284
See application file for complete search history.

(56) References Cited

U.S. PATENT DOCUMENTS

2006/0046407 A1* 3/2006 Juengling ...................... 438/301
2007/0287101 A1* 12/2007 Kim et al. ...................... 430/313

* cited by examiner

*Primary Examiner* — Fernando L Toledo
*Assistant Examiner* — Valerie N Brown
(74) *Attorney, Agent, or Firm* — F. Chau & Associates, LLC

(57) ABSTRACT

A method of fabricating a semiconductor device in which a plurality of conductive lines having a fine pitch and a uniform thickness can be formed is provided. The method includes forming a plurality of first conductive patterns in a insulation layer as closed curves, forming a plurality of mask patterns on the insulation layer, the mask patterns exposing end portions of each of the first conductive patterns, and forming a plurality of second conductive patterns in the insulation layer as lines by removing the end portions of each of the first conductive patterns.

8 Claims, 9 Drawing Sheets

US 8,361,849 B2

METHOD OF FABRICATING SEMICONDUCTOR DEVICE

CROSS-REFERENCE TO RELATED PATENT APPLICATION

This application is a Divisional Application of U.S. patent application Ser. No. 12/136,626 filed on Jun. 10, 2008 now U.S. Pat. No. 7,989,279 which claims priority to and the benefit of Korean Patent Application No. 10-2007-0066187, filed on Jul. 2, 2007, in the Korean Intellectual Property Office the entire contents of both of which are incorporated by reference herein.

BACKGROUND

1. Technical Field

The present invention relates to a method of fabricating a semiconductor device, and, more particularly, to a method of fabricating a semiconductor device in which conductive lines are buried in a semiconductor substrate.

2. Description of the Related Art

As the integration density of semiconductor devices increases, the pitch of patterns in semiconductor devices is becoming increasingly smaller. However, due to limits in the resolution of lithography, it is difficult to form micro-patterns such as line-and-space patterns.

In order to address this difficulty, methods of forming micro-patterns using spacer patterns as masks have been developed. These methods typically involve forming dummy patterns, forming spacer patterns on both sides of each of the dummy patterns and forming micro-patterns using the spacer patterns as masks. These techniques require many additional processing steps, however, and thus result in more expensive fabrication of the semiconductor devices. Consequently, a need remains for a simpler and less expensive method of forming semiconductor devices having fine pattern pitch.

SUMMARY

Aspects of the present invention provide a method of fabricating a semiconductor device in which conductive lines having a fine pitch and a uniform thickness can be buried in a semiconductor substrate.

According to an aspect of the present invention, there is provided a method of fabricating a semiconductor device, the method including: forming a plurality of first conductive patterns in a insulation layer as closed curves; forming a plurality of mask patterns on the insulation layer, the mask patterns exposing end portions of each of the first conductive patterns; and forming a plurality of second conductive patterns in the insulation layer as lines by removing the end portions of each of the first conductive patterns.

BRIEF DESCRIPTION OF THE DRAWINGS

The above and other aspects and features of the present invention will become apparent by describing in detail exemplary embodiments thereof with reference to the attached drawings, in which.

DETAILED DESCRIPTION

Figure 1:
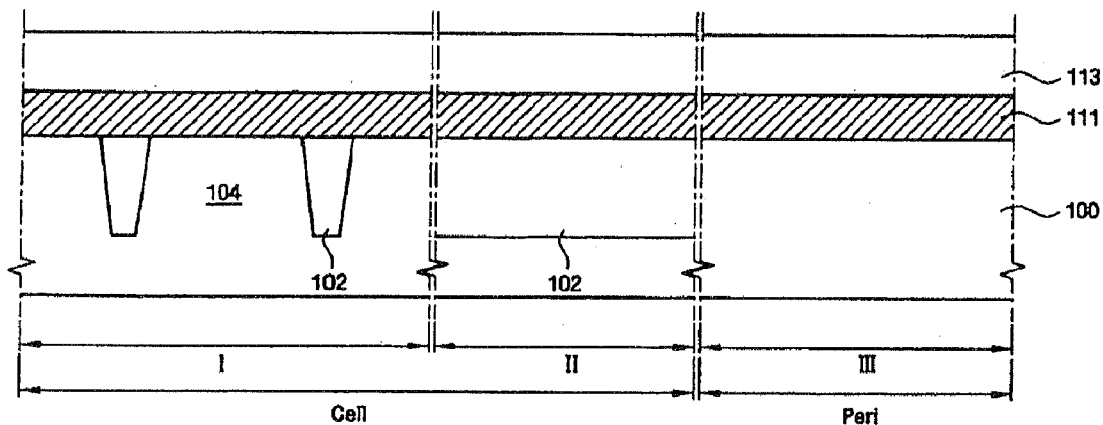
FIGS. 1 through 12B illustrate a method of fabricating a semiconductor device according to an exemplary embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

It will be understood that when an element or a layer is referred to as being "on" or "above" another element or layer, it can be directly on or above the other element or layer or intervening elements or layers may be present. In contrast, when an element or a layer is referred to as being "directly on" or "directly above" another element or layer, there are no intervening elements or layers present. Like numbers refer to like elements throughout. As used herein the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing.

A method of fabricating a semiconductor device according to an exemplary embodiment of the present invention will hereinafter be described in detail with reference to FIGS. 1 through 12B.

FIGS. 1 through 12B illustrate a method of fabricating a semiconductor device according to an exemplary embodiment of the present invention. Specifically, FIGS. 2A, 6A, 9A, 11A and 12A illustrate plan views for explaining a method of fabricating a semiconductor device according to an exemplary embodiment of the present invention, and FIGS. 2B, 6B, 9B, 11B and 12B illustrate cross-sectional views taken along lines A-A', B-B', and C-C' of FIGS. 2A, 6A, 9A, 11A and 12A, respectively.

Referring to FIG. 1, a semiconductor substrate 100 which is divided into a cell region Cell and a peripheral circuit region Peri is prepared. The semiconductor substrate 100 may include bulk silicon or bulk silicon-germanium. Alternatively, the semiconductor substrate 100 may include bulk silicon or bulk silicon-germanium and a silicon epitaxial layer or a silicon-germanium epitaxial layer deposited on the bulk silicon or the bulk silicon-germanium. Device isolation layers 102 are formed in the semiconductor substrate 100 by performing a shallow trench isolation (STI) operation. As a result of the formation of the device isolation layers 102, a plurality of active regions 104 may be formed in the cell region Cell and in the peripheral circuit region Peri, respectively.

Thereafter, first and second hard mask layers 111 and 113 are sequentially formed on the semiconductor substrate 100 including the active regions 104. The first and second hard mask layers 111 and 113 may be formed of a material having etching selectivity with respect to the semiconductor substrate 100. For example, the first hard mask layer 111 may include a conductive layer, and the second hard mask layer 113 may include an insulation layer. The first hard mask layer 111 will hereinafter be referred to as the first conductive layer 111, and the second hard mask layer 113 will hereinafter be referred to as the first insulation layer 113. In this embodiment, the first conductive layer 111 and the first insulation layer 113 are sequentially formed on the semiconductor substrate 100. A polysilicon layer may be deposited on the semiconductor substrate 100 as the first conductive layer 111, and a silicon nitride layer may be formed on the first conductive layer 111 as the first insulation layer 113.

In order to form a gate electrode in the peripheral circuit region Peri, an insulation layer (not shown) for forming a gate may be formed on the semiconductor substrate 100 before the formation of the first conductive layer 111. The insulation layer for forming a gate may include a silicon oxide layer or a high-dielectric layer.

The first conductive layer 111 may be used to form a mask in the cell region Cell, and to form a conductive pattern in the peripheral circuit region Peri.

Figure 2A:
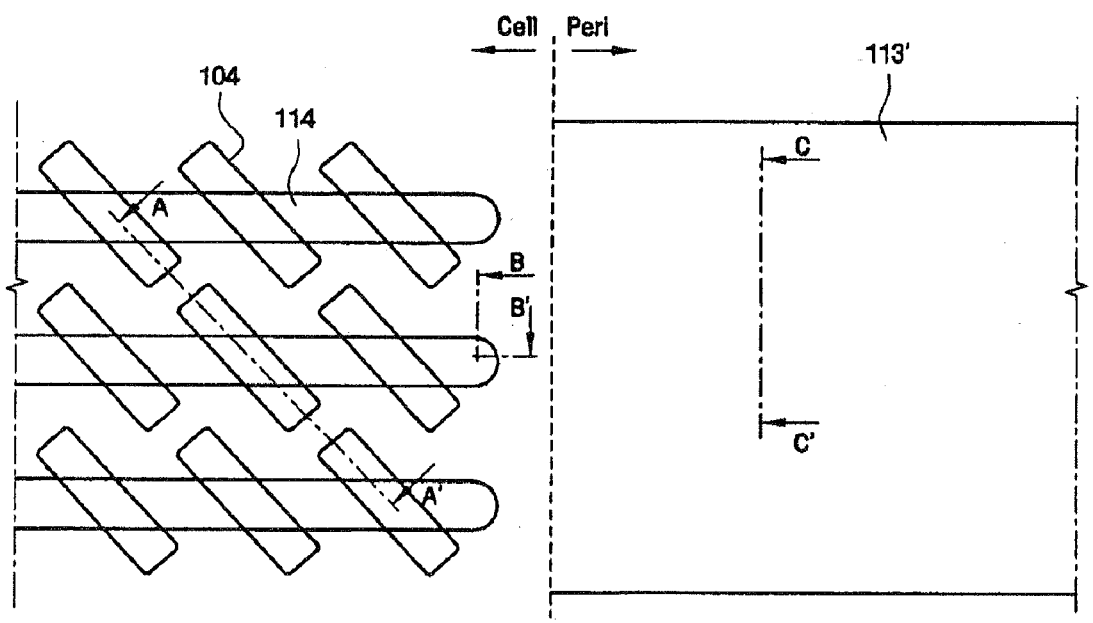
Figure 2B:
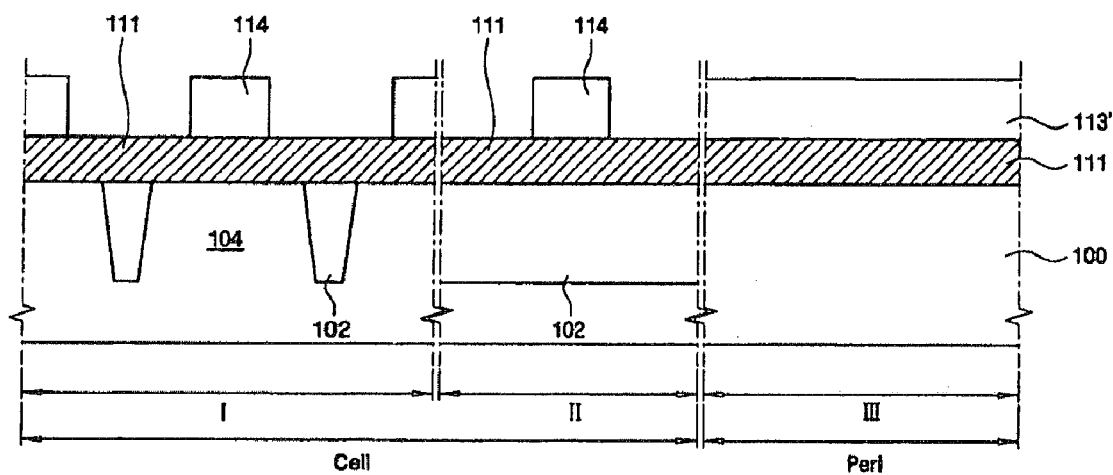

Referring to FIGS. 2A and 2B, first insulation patterns 114 are formed on the first conductive layer 111 as line-and-space patterns by patterning the first insulation layer 113 in the cell region Cell. The first insulation patterns 114 extend across the active regions 104 in the cell region Cell of the semiconductor substrate 100. During the formation of the first insulation patterns 114 in the cell region Cell, the first conductive layer 111 and the first insulation layer 113 in the peripheral circuit region Peri are not patterned and thus remain intact on the semiconductor substrate 100. That is, the peripheral circuit region Peri of the semiconductor substrate 100 is still covered with the first conductive layer 111 and a first insulation layer 113'.

Figure 3:
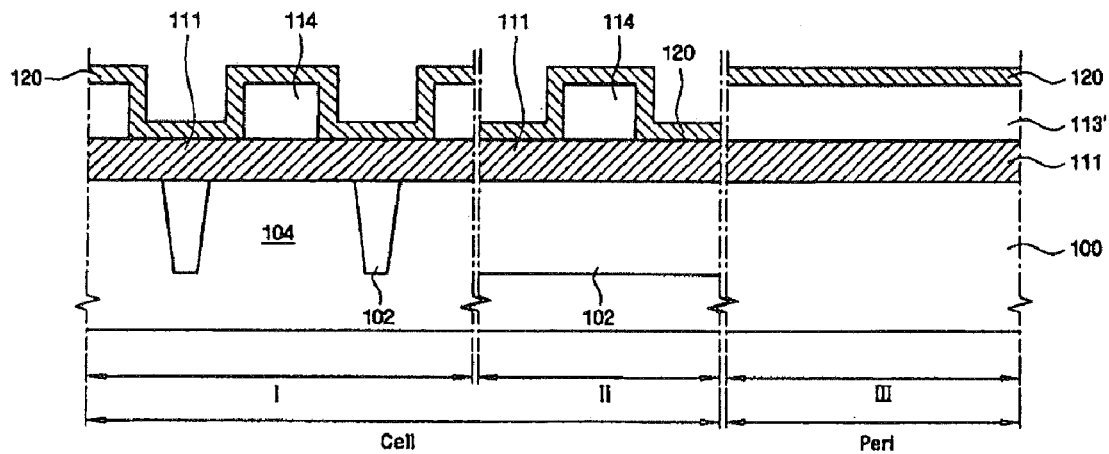

Referring to FIG. 3, a spacer layer 120 is formed on the entire surface of the semiconductor substrate 100 on which the first insulation patterns 114 are formed. The spacer layer 120 is formed in the cell region Cell, conforming to the shape of the first insulation patterns 114. The spacer layer 120 is also formed in the peripheral circuit region Peri and is deposited on the first insulation layer 113'. The spacer layer 120 may be formed of a material having etching selectivity to the first insulation patterns 114. Specifically, the spacer layer 120 may be formed of a material having high etching selectivity to the first insulation patterns 114. For example, the spacer layer 120 may be formed by depositing a polysilicon layer on the semiconductor substrate 100 so that the polysilicon layer can conform to the shape of the first insulation patterns 114. The spacer layer 120 may be formed using a chemical vapor deposition (CVD) method or an atomic layer deposition (ALD) method. The pitch of fine patterns to be formed in the cell region Cell by a subsequent process may be determined by the thickness of the spacer layer 120.

In order to form a spacer pattern as a line on both sides of each of the first insulation patterns 114, portions of the spacer layer 120 on the sidewalls of each of the first insulation patterns 114 in a boundary portion II of the cell region Cell may be etched away. During an etching operation for removing the portions of the spacer layer 120 on the sidewalls of each of the first insulation patterns 114 in the boundary portion II of the cell region Cell, the first insulation patterns 114 in the boundary area II may also be etched away so that a step difference can be generated between a middle portion I and the boundary portion II of the cell region Cell. In order to reduce the step difference between the middle portion I and the boundary portion II of the cell region Cell, an insulation material may be deposited on the semiconductor substrate 100, and then a planarization operation may be performed. In this case, the step difference between the middle portion I and the boundary portion II of the cell region Cell may be reduced to some extent. However, the insulation material may not be able to be completely planarized due to its deposition properties, thereby making it difficult to form conductive patterns in respective corresponding trenches to a uniform thickness.

Figure 4:
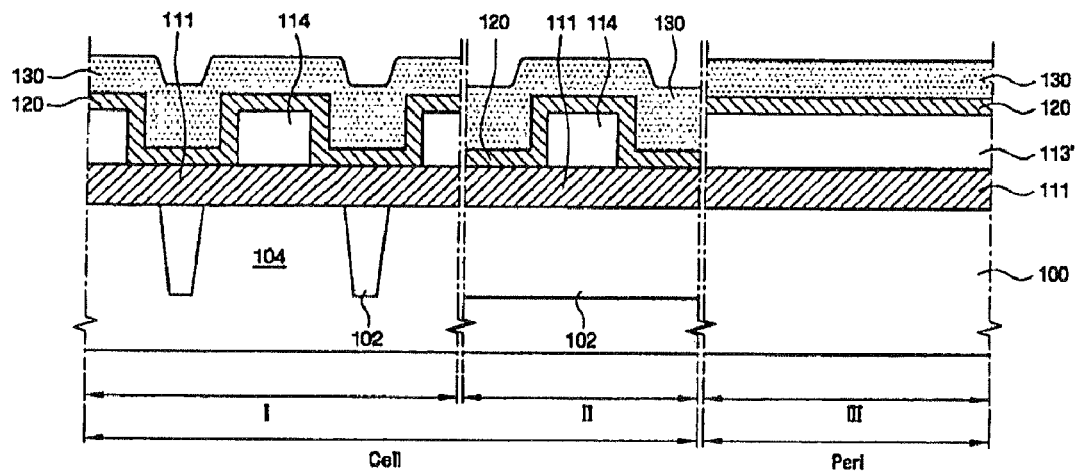

Therefore, in this embodiment, a second insulation layer 130 is formed on the spacer layer 120 so that the empty spaces between the first insulation patterns 114 can be filled with the second insulation layer 130, as illustrated in FIG. 4. The second insulation layer 130 may be formed of a material having etching selectivity to the spacer layer 120. The second insulation layer 130 may be formed of the same material as the first insulation patterns 114.

Figure 5:
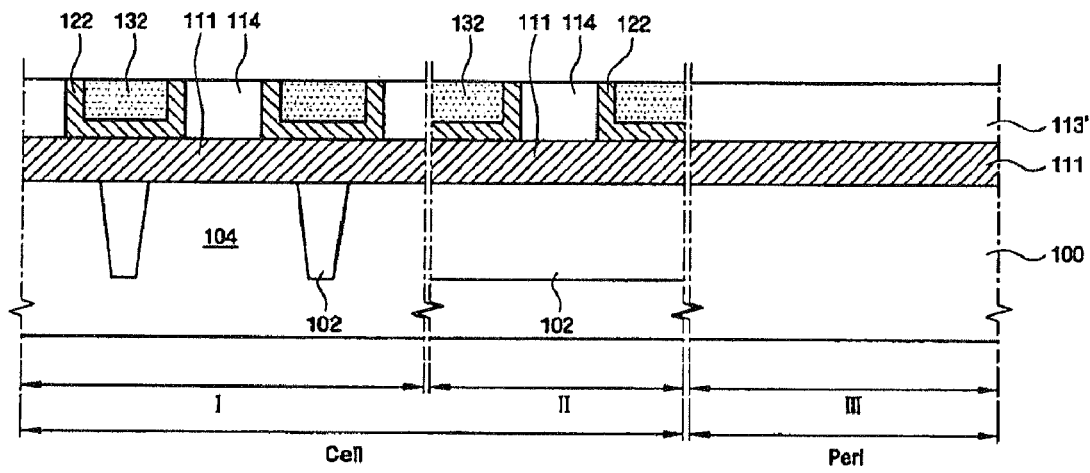

Thereafter, referring to FIG. 5, the top surfaces of the first insulation patterns 114 are exposed by selectively etching the second insulation layer 130 and the spacer layer 120. Specifically, the second insulation layer 130 is etched using the spacer layer 120 as an etching stopper, and then the spacer layer 120 is etched until the top surfaces of the first insulation patterns 114 are exposed. An etch-back operation or a chemical mechanical polishing (CMP) operation may be performed in order to expose the top surfaces of the first insulation patterns 114. As a result of the etch-back operation or the CMP operation, the spacer layer 120 and the second insulation layer 130 in the peripheral circuit region Peri are all removed, and a plurality of spacer patterns 122 and a plurality of second insulation patterns 132 are formed in the cell region Cell.

The spacer patterns 122 are disposed among the first insulation patterns 114, and the second insulation patterns 132 are disposed on the respective spacer patterns 122. The spacer patterns 122 cover the sidewalls of the first insulation patterns 114. That is, the spacer patterns 122 may be formed as closed curves and cover the sidewalls of the first insulation patterns 114.

During the formation of the spacer patterns 122, the first insulation patterns 114 and the second insulation patterns 132 may be planarized so that the top surfaces of the first insulation patterns 114 and the second insulation patterns 132 can become level with the top surfaces of the spacer patterns 122.

Figure 6A:
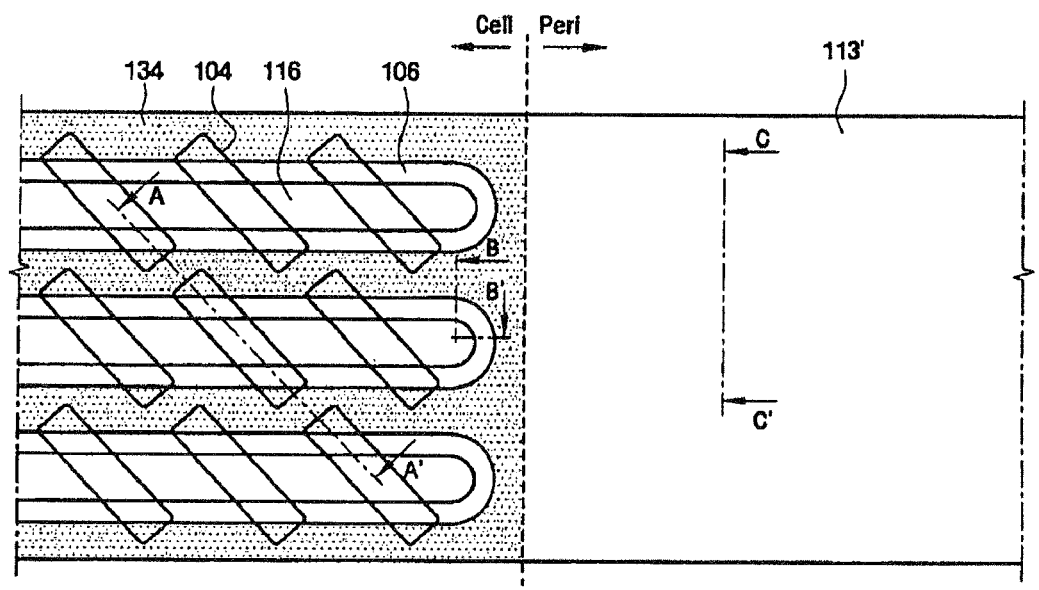
Figure 6B:
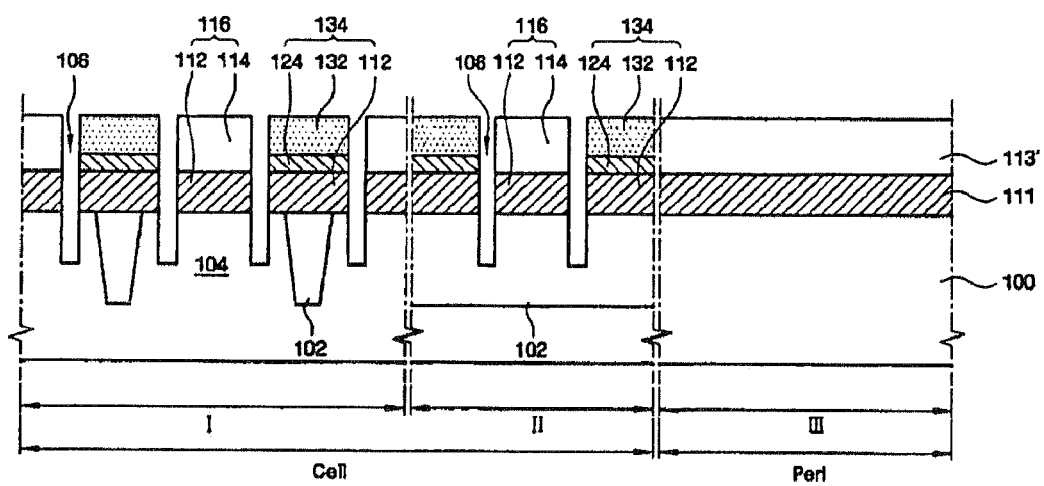

Referring to FIGS. 6A and 6B, portions of the spacer patterns 122 between the first insulation patterns 114 and the respective second insulation patterns 132 are removed, and portions of the first conductive layer 111 exposed between the first insulation patterns 114 and the respective second insulation patterns 132 are etched so that portions of the semiconductor substrate 100 in the cell region Cell can be exposed. Since the spacer patterns 122 are formed of a material having etching selectivity to the first insulation patterns 114 and the second insulation patterns 132, the spacer patterns 122 may be partially removed by performing a dry etching operation using the first insulation patterns 114 and the second insulation patterns 132 as etching masks. As a result of the dry etching operation, a plurality of first mask patterns 116, a plurality of second mask patterns 134 and a plurality of openings which are disposed between the first mask patterns 116 and the respective second mask patterns 134 and expose portions of the second substrate 100 as closed curves are formed in the cell region Cell of the semiconductor substrate 100. The first mask patterns 116 include the first insulation patterns 114, respectively, and the first conductive patterns 112, respectively. The second mask patterns 134 include the first conductive patterns 112, respectively, a plurality of patterns 124, respectively, and the second insulation patterns 132, respectively. The patterns 124 are obtained by partially removing the second spacer patterns 122. Thereafter, the semiconductor substrate 100 is etched to a predetermined depth using the first mask patterns 116 and the second mask patterns 134 as etch masks, thereby forming a plurality of trenches 106 in the semiconductor substrate 100. Specifically, the trenches 106 are formed by performing a dry etching operation on the active regions 104 and the device isolation layers 102 in the cell region Cell. The trenches 106 may be formed as closed curves that extend across the active regions 104 in the cell region Cell of the semiconductor substrate 100.

Figure 7:
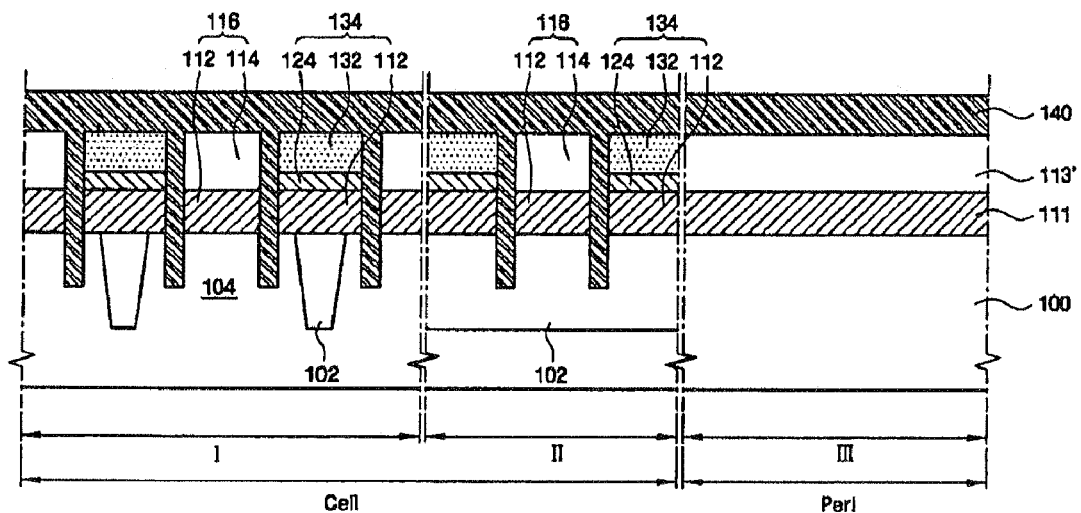

Referring to FIG. 7, a second conductive layer 140 is formed on the entire surface of the semiconductor substrate 100, Specifically, an insulation layer (not shown) for forming a gate is formed so that the sidewalls of each of the trenches 106 and the sidewalls and the top surface of each of the first mask patterns 116 and the second mask patterns 134 can be covered with the insulation layer for forming a gate. The insulation layer for forming a gate may include a silicon oxide layer or a high-dielectric layer. The second conductive layer 140 is a conductive layer formed in the cell region Cell for forming a gate. The second conductive layer 140 may be formed of a material such that the trenches 106 can be completely filled with the second conductive layer 140. For example, the second conductive layer 140 may be formed by depositing a titanium nitride (TiN) layer. The second conductive layer 140 is formed in the trenches 106 and on the first mask patterns 116 and the second mask patterns 134. Since the first mask patterns 116, the second mask patterns 134, and a first insulation layer 113' in the peripheral circuit region Peri are all planarized, the second conductive layer 140 may be formed on the first mask patterns 116, the second mask patterns 134, and the first insulation layer 113' to a substantially uniform thickness.

Figure 8:
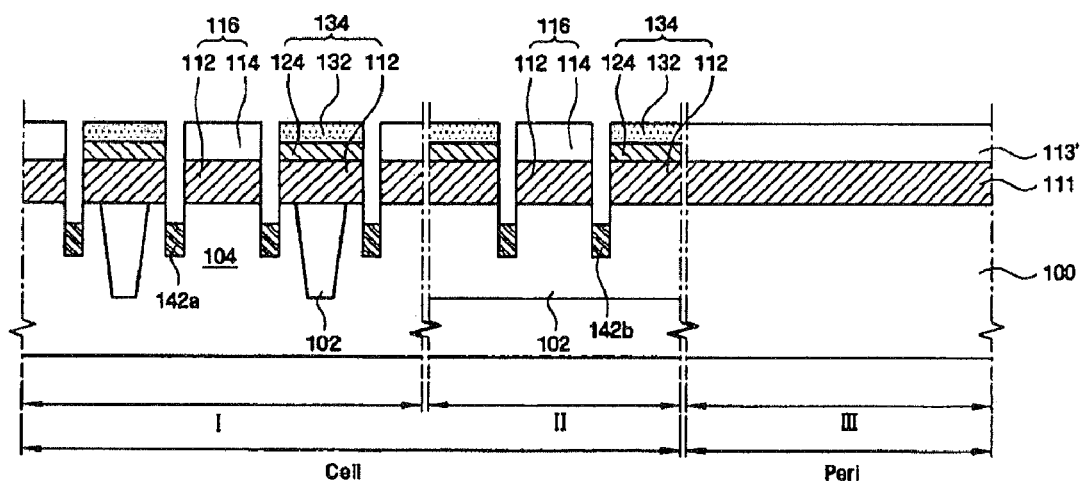

Referring to FIG. 8, a plurality of second conductive patterns 142a and a plurality of second conductive patterns 142b are formed by etching the second conductive layer 140. The trenches 106 are partially filled with the respective second conductive patterns 142a and 142b. Specifically, a dry etching operation is performed on the second conductive layer 140 so that the second conductive layer 140 only partially remains in the trenches 106. Since the dry etching operation is performed until the second conductive layer 140 remains only partially in the trenches 106, the first mask patterns 116, the second mask patterns 134 and the first insulation layer 113' may be partially etched away by the dry etching operation.

The second conductive patterns 142a and 142b are respectively formed in the trenches 106 and have the same shape as the trenches 106, i.e., a closed curve shape. The top surfaces of the second conductive patterns 142a and 142b are below the surfaces of the active regions 104. The second conductive patterns 142a and 142b may be formed in the respective trenches 106 to a uniform thickness by performing a dry etching operation on the second conductive layer 140.

Figure 9A:
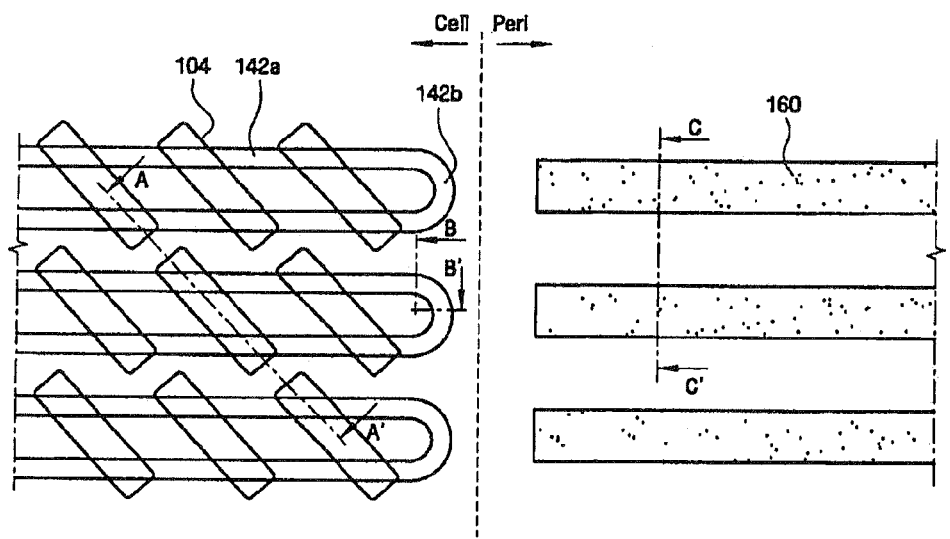
Figure 9B:
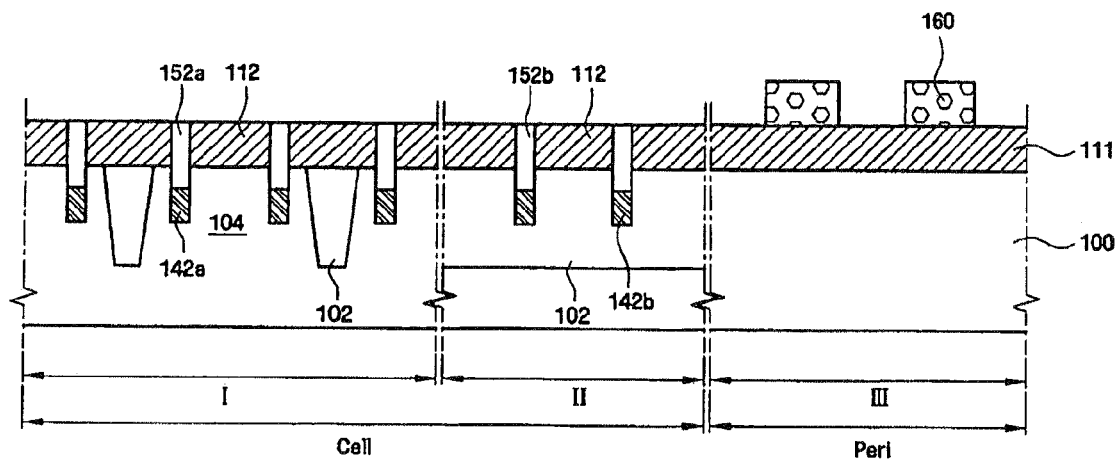

Thereafter, referring to FIGS. 9A and 9B, a plurality of capping patterns 152a are formed in the respective second conductive patterns 142a, and a plurality of capping patterns 152b are formed in the respective second conductive patterns 142b. Specifically, a capping layer (not shown) is formed on the semiconductor substrate 100 so that the trenches 106 and the empty spaces between the first mask patterns 116 and the respective mask patterns 134 can be completely filled with the capping layer. Thereafter, the capping layer is planarized, thereby forming the capping patterns 152a and 152b. The capping layer may include a silicon nitride layer. The capping patterns 152a and 152b may be formed by performing an anisotropic etching operation on the capping layer. The capping layer may be etched until the top surfaces of the first conductive patterns 112 are exposed. That is, during the formation of the capping patterns 152a and 152b, the first insulation patterns 114 of the first mask patterns 116 and the second insulation patterns 132 of the second mask patterns 134 are all etched away. As a result, the first conductive patterns 112 in the cell region Cell are exposed, and the first conductive layer 111 in the peripheral circuit region Peri is exposed.

Thereafter, a plurality of first photoresist patterns 160 for forming conductive patterns in the peripheral circuit region Peri are formed on the first conductive layer 111 in the peripheral circuit region Peri. Since conductive patterns generally formed in a peripheral circuit region have a relatively large line width and are relatively distant apart from one another, the first photoresist pattern 160 is formed in the peripheral circuit region Peri so that larger patterns than those in the cell region Cell can be formed in the peripheral circuit region Peri.

Figure 10:
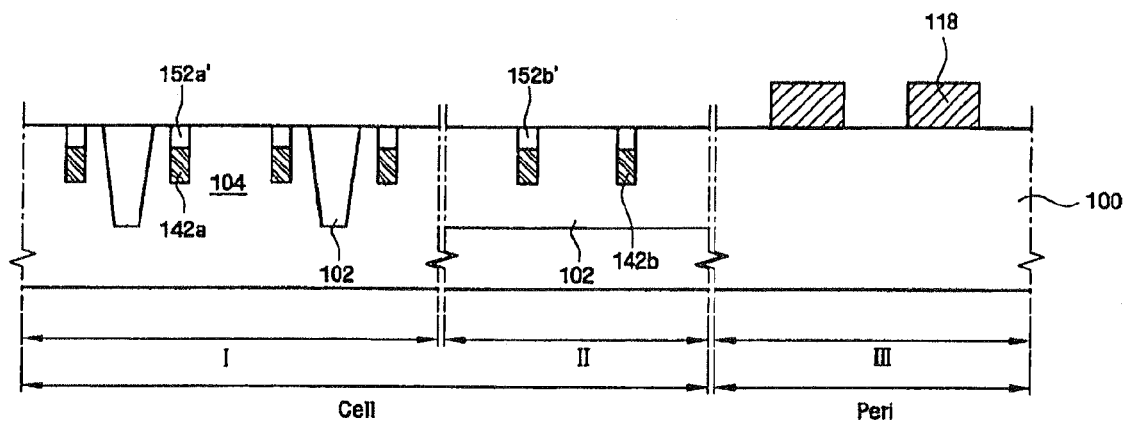

Thereafter, referring to FIG. 10, a plurality of conductive patterns 118 are formed in the peripheral circuit region Peri using the first photoresist patterns 160. Specifically, the conductive patterns 118 are formed in the peripheral circuit region Peri by patterning the first conductive layer 111 using the first photoresist patterns 160. During the formation of the conductive patterns 118, the first conductive patterns 112 and the capping patterns 152a and 152b are partially etched away.

As a result, the formation of the second conductive patterns 142a and 142b in the semiconductor substrate 100 as closed curves is completed. The second conductive patterns 142*a* and 142*b* extend to the device isolation layers 102 across the active regions 104 in the cell region Cell, and are buried in the semiconductor substrate 100. In the cell region Cell, the surface of the semiconductor substrate 100 and the top surfaces of a plurality of capping patterns 152*a'* and a plurality of capping patterns 152*b'* are exposed. The surface of the semiconductor substrate 100 may be level with the top surfaces of the capping patterns 152*a'* and 152*b'*. In the peripheral circuit region Peri, the conductive patterns 118 are formed on the semiconductor substrate 100. After the formation of the conductive patterns 118 in the peripheral circuit region Peri, the first photoresist pattern may be removed by performing an ashing operation.

Thereafter, the second conductive patterns 142*a* and 142*b* are divided into as many pairs of conductive line patterns as there are second conductive patterns 142*a* and 142*b* by removing portions of the second conductive patterns 142*a* and 142*b* in the boundary portion II of the cell region Cell.

Figure 11A:
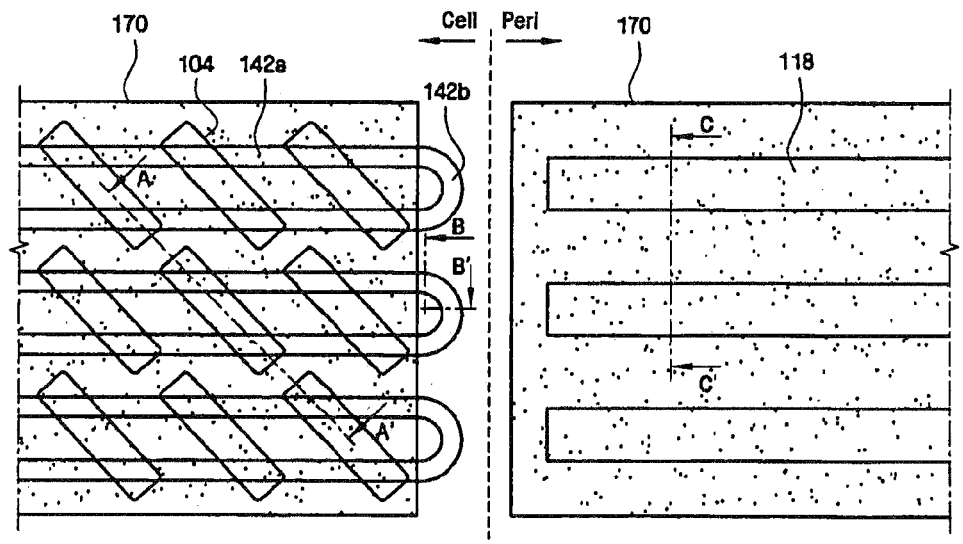
Figure 11B:
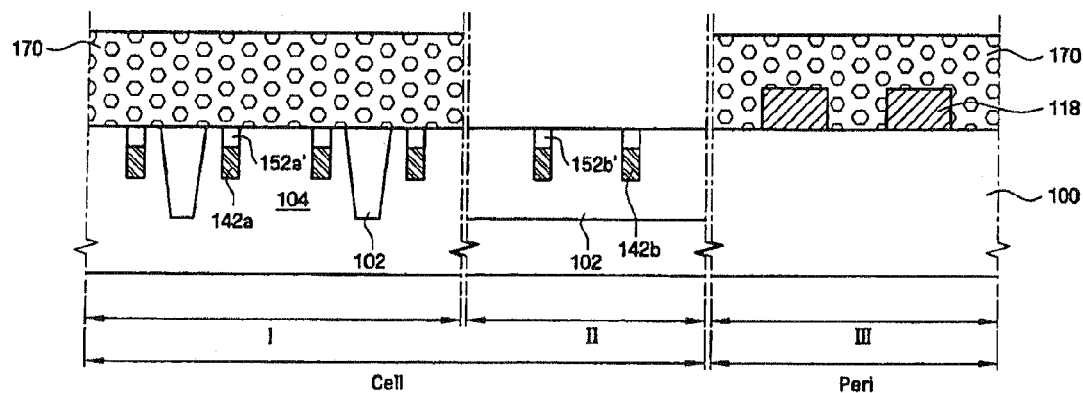

Specifically, referring to FIGS. 11A and 11B, a photoresist layer (not shown) is formed on the entire surface of the semiconductor substrate 100 so that the conductive patterns 118 in the peripheral circuit region can be completely buried in the photoresist layer. Thereafter, a plurality of second photoresist patterns 170 which expose the boundary portion II of the cell region Cell are formed by patterning the photoresist layer.

Then, a dry etching operation is performed using the second photoresist patterns as etch masks so that portions of the capping patterns 152*b'* in the boundary portion II of the cell region Cell and the portions of the second conductive patterns 142*a* and 142*b* in the boundary portion II of the cell region Cell can be selectively etched away. During the dry etching operation, an etching gas having etching selectivity to the device isolation layers 102 in the semiconductor substrate 100 may be used. For example, if the second conductive patterns 142*a* and 142*b* include a titanium nitride layer, a mixture of Cl, BCl3 and Ar may be used as an etching gas for removing the portions of the second conductive patterns 142*a* and 142*b* in the boundary portion II of the cell region 170.

Figure 12A:
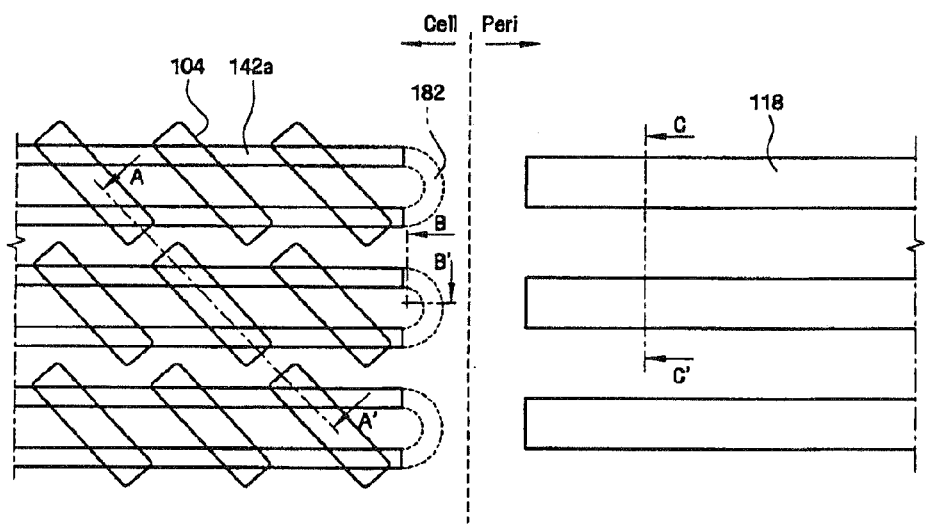
Figure 12B:
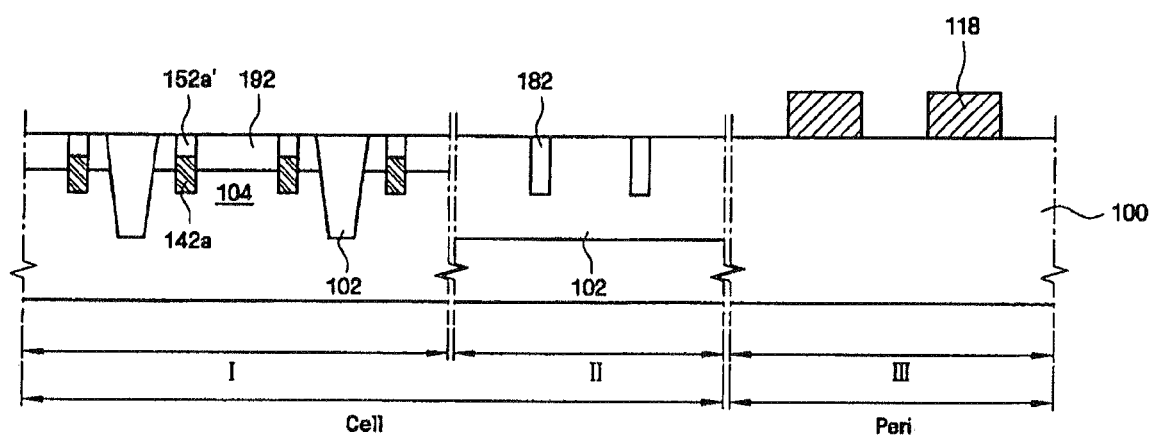

Referring to FIGS. 12A and 12B, a plurality of pairs of conductive lines 142*a* are formed in the cell region Cell of the semiconductor substrate 100. The conductive lines 142*a* extend across the active regions 104 and are buried in the semiconductor substrate 100. A plurality of trenches resulting from the removal of the portions of the second conductive patterns 142*a* and 142*b* in the boundary portion II of the cell region Cell are filled with an insulation material 182 so that the surface of the semiconductor substrate 100 can be planarized.

In this manner, a plurality of gate lines 142*a* having a fine pitch and a uniform thickness are formed in the middle portion I of the cell region Cell and are buried in the semiconductor substrate 100.

Thereafter, impurity ions are implanted into active regions 104 on both sides of each of the gate lines 142*a*, thereby forming source/drain regions 192. Therefore, a plurality of transistors having the gate lines 142*a* that are buried in the semiconductor substrate 100 are formed in the cell region Cell.

As described above, the gate lines 142*a* are formed in the middle portion I of the cell region Cell by forming the second conductive patterns 142*a* and 142*b* throughout the entire cell region Cell to a uniform thickness as closed curves and selectively etching the portions of the second conductive patterns 142*a* and 142*b* in the boundary portion II of the cell region Cell. Thus, the gate lines 142*a* have a uniform thickness and a fine pitch. Therefore, it is possible to form a plurality of gate electrodes having a uniform size in the cell region Cell and thus to uniformly maintain the properties of each cell.

As described above, according to some embodiments of the present invention, a plurality of trenches are formed in a semiconductor substrate as closed curves by forming a plurality of mask patterns on the semiconductor substrate to a uniform thickness. Therefore, it is possible to uniformly deposit a conductive layer in each of the trenches. In addition, it is possible to form a plurality of conductive patterns having a uniform thickness in the respective trenches as closed curves by performing an anisotropic etching operation on the conductive layer.

In addition, according to some embodiments of the present invention, after the formation of conductive patterns in respective corresponding trenches, a semiconductor substrate is planarized, and end portions of the conductive patterns are selectively removed, thereby forming as many pairs of conductive lines as there were conductive patterns. Therefore, it is possible to form a plurality of conductive lines having a uniform thickness and a fine pitch in a semiconductor substrate.

Moreover, according to some embodiments of the present invention, a plurality of conductive lines are formed in a cell region of a semiconductor substrate, thereby forming a plurality of gate lines that are buried in the semiconductor substrate and have a uniform thickness. Therefore, it is possible to uniformly maintain the properties of each cell.

According to an aspect of the present invention, there is provided a method of fabricating a semiconductor device, the method including: forming a plurality of first conductive patterns in a insulation layer as closed curves; forming a plurality of mask patterns on the insulation layer, the mask patterns exposing end portions of each of the first conductive patterns; and forming a plurality of second conductive patterns in the insulation layer as lines by removing the end portions of each of the first conductive patterns.

According to another aspect of the present invention, there is provided a method of fabricating a semiconductor device, the method including: defining a plurality of active regions in a substrate; forming a plurality of trenches in the substrate as closed curves, the trenches extending across the active regions; sequentially forming a plurality of conductive patterns and a plurality of insulation patterns in the respective trenches; forming a plurality of mask patterns on the substrate, the mask patterns exposing end portions of each of the conductive patterns; and forming a plurality of gate lines buried in the substrate by removing the end portions of each of the conductive patterns.

According to another aspect of the present invention, there is provided a method of fabricating a semiconductor device, the method including: providing a substrate having a cell region and a peripheral circuit region; defining a plurality of active regions in the substrate by forming a plurality of device isolation layers; depositing a conductive layer and an insulation layer on a substantially entire surface of the substrate; forming a plurality of first mask patterns in the cell region as closed curves, the first mask patterns extending across the active regions and partially exposing the surface of the substrate; forming a plurality of trenches in the cell region as closed curves; sequentially forming a plurality of first conductive patterns and a plurality of capping patterns in the respective trenches; forming a plurality of second conductive patterns in the peripheral circuit region by patterning portions of the conductive layer in the peripheral circuit region and portions of the insulation layer in the peripheral circuit region, wherein the first mask patterns are removed during the forming of the second conductive patterns; forming a plurality of second mask patterns on the substrate, the second mask patterns exposing end portions of each of the first conductive patterns; and forming a plurality of gate lines in the substrate by removing the end portions of each of the conductive patterns.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device, comprising:
   defining a plurality of active regions in a substrate;
   forming a plurality of trenches in the substrate as closed curves, the trenches extending across the active regions;
   sequentially forming a plurality of conductive patterns and a plurality of insulation patterns in the respective trenches; forming a plurality of mask patterns on the substrate, the mask patterns exposing end portions of each of the conductive patterns; and
   forming a plurality of gate lines buried in the substrate by removing the end portions of each of the conductive patterns using the mask patterns.

2. The method of claim 1, wherein top surfaces of the insulation patterns are level with a surface of the substrate.

3. The method of claim 1, wherein the forming of the trenches comprises:
   forming a plurality of first mask patterns on the substrate as lines, the first mask patterns extending across the active regions;
   forming a plurality of spacer patterns on sidewalls of the first mask patterns;
   forming a plurality of second mask patterns among the spacer patterns so that spaces among the spacer patterns are filled with the second mask patterns;
   removing portions of the spacer patterns between the first mask patterns and the respective second mask patterns; and
   etching the substrate to a predetermined depth using the first mask patterns and the second mask patterns as an etch mask.

4. The method of claim 3, wherein top surfaces of the first mask patterns, top surfaces of the spacer patterns, and top surfaces of the second mask patterns are level with one another.

5. The method of claim 4, wherein the forming of the second mask patterns comprises:
   forming a spacer layer on the substrate such that the spacer layer conforms to the shape of the first mask patterns;
   depositing on the spacer layer an insulation layer for forming the second mask patterns; and
   etching the spacer layer and the insulation layer for forming the second mask patterns until the top surfaces of the first mask patterns are exposed.

6. The method of claim 1, wherein the spacer patterns comprise a material having etching selectivity to the first mask patterns and the second mask patterns.

7. The method of claim 1, wherein the forming of the gate lines comprises sequentially etching end portions of the insulation patterns and the end portions of each of the conductive patterns.

8. The method of claim 1, further comprising forming an insulation layer on inner sidewalls of each of the trenches, before the forming of the conductive patterns.

* * * * *